United States Patent [19]
Sebald et al.

[11] Patent Number: 5,360,693
[45] Date of Patent: Nov. 1, 1994

[54] POSITIVE O-QUINONE DIAZIDE PHOTORESIST CONTAINING BASE COPOLYMER UTILIZING MONOMER HAVING ANHYDRIDE FUNCTION AND FURTHER MONOMER THAT INCREASES ETCH RESISTANCE

[75] Inventors: Michael Sebald, Hessdorf-Hannberg; Recai Sezi, Roettenbach; Rainer Leuschner, Grossenseebach; Seigfried Birkle, Hoechstadt A/Aisch; Hellmut Ahne, Roettenbach, all of Germany

[73] Assignee: Siemens Aktiengesellschaft, Munich, Germany

[21] Appl. No.: 59,518

[22] Filed: May 10, 1993

Related U.S. Application Data

[63] Continuation of Ser. No. 849,802, Mar. 11, 1992, abandoned, which is a continuation of Ser. No. 490,432, Mar. 8, 1990, abandoned.

[30] Foreign Application Priority Data

Mar. 20, 1989 [EP] European Pat. Off. ............ 89104950

[51] Int. Cl.$^5$ ................................................ 1506 G03F
[52] U.S. Cl. ...................... 430/192; 430/193; 430/313; 430/326; 430/331
[58] Field of Search ............... 430/270, 192, 193, 313; 522/148; 526/271

[56] References Cited

U.S. PATENT DOCUMENTS

| | | |
|---|---|---|
| 2,990,281 | 6/1961 | Printy et al. . |
| 3,884,693 | 5/1975 | Bauer et al. ............... 430/167 |
| 4,196,003 | 4/1980 | Watanabe ................... 430/193 |
| 4,720,445 | 1/1988 | Brahim et al. . |
| 4,791,176 | 12/1988 | Birkle et al. ............... 525/326.5 |

FOREIGN PATENT DOCUMENTS

| | | |
|---|---|---|
| 0229629 | 7/1984 | European Pat. Off. . |
| 0070201 | 3/1987 | European Pat. Off. . |

OTHER PUBLICATIONS

Moss et al, Plasma Oxidation of Polymers, Plasma Chemistry and Plasma Processing 6 (1986) Dec., No. 4, Bristol, Gr. Britain, pp. 401–415.

Moreau, Shelf Life Extender for Polymeric Material, IBM Technical Disclosure Bulletin, vol. 23, No. 7B, Dec. 1980, p. 3203.

Osuch et al, A New Class of Resins for Deep Ultraviolet Photoresists, SPIE, vol. 631, Advances in Resist Technology and Processing III (1986), p. 68–75.

Pampalone, Novolac Resins Used in Positive Resist Systems, Solid State Technology, Jun. 1984, pp. 115–120.

Patent Abstracts of Japan, vol. 10, No. 154 (P463) [2210], Jun. 4, 1986.

*Primary Examiner*—Charles L. Bowers, Jr.
*Assistant Examiner*—Christopher G. Young
*Attorney, Agent, or Firm*—Hill, Steadman & Simpson

[57] ABSTRACT

An aqueous-alkaline developable photoresist suitable for a lithography in deep ultraviolet light and having a structural resolution in the sub-$\mu$m range. The photoresist contains a developable base polymer that comprises anhydride functions that act as solubility-mediating groups and also contains a photo-active component. In addition to being constructed of monomers carrying anhydride groups, the base polymer can be constructed of further monomers that produce designationally defined properties in the photoresist, for example, exhibit resistance to plasma etching processes. The photoresist of the present invention is therefore very versatile.

7 Claims, 1 Drawing Sheet

POSITIVE O-QUINONE DIAZIDE PHOTORESIST CONTAINING BASE COPOLYMER UTILIZING MONOMER HAVING ANHYDRIDE FUNCTION AND FURTHER MONOMER THAT INCREASES ETCH RESISTANCE

This is a continuation of application Ser. No. 07/849,802, filed Mar. 11, 1992, now abandoned which is a continuation of U.S. Ser. No. 490,432, filed Mar. 8, 1990, now abandoned.

BACKGROUND OF THE INVENTION

The present invention relates to a photoresist that can be developed in an aqueous alkaline solution, for generating structures in the sub-$\mu$m range. The photoresist is composed of a developable base polymer, a photoactive component, and, as desired, additives.

Positive photoresists, that can be developed in an aqueous-alkaline solution, are presently used for the generation of photolithographic structures, and the transfer of a structure from a master (mask) onto a substrate, for example onto a wafer. These photoresists are essentially composed of an alkali-soluble base polymer and a photo-active component (PAC).

These photoresists function by what can be characterized as the solution inhibitor principle. The presence of a hydrophobic PAC in the photoresist effectively reduces the solubility of the base polymer in the aqueous-alkaline developer. It is only when the photoresist is irradiated with light having a suitable wavelength that the PAC is converted, through a photochemical process, into a hydrophilic compound. Once the PAC is so converted, the polar and, thus, hydrophilic groups, become available in the exposed regions, and are soluble to the developer. In this process, the base polymer is chemically dissolved by the developer, only in those exposed regions that are accessible to the developer.

Typical photoresists can be adapted to photolithography processes through the use of light in the visible range (for example, 436 nm) or light in the near ultraviolet range (for example, 365 nm). However, using these photoresist systems, only structures up to about 0.5 $\mu$m can be optically resolved and therefore, produced. According to the formula $$CF = k\frac{\lambda}{NA}$$

the smallest imaged structure CD is proportional to the wavelength $\lambda$ used for the exposure. In the formula, NA is the numerical aperture and represents a parameter of the optics used for the imaging, whereas k is a processed-associated factor.

In order to further increase the packing density of integrated circuits or memory modules in micro-electronics, it is necessary to reduce the dimensions of the structure. This can be accomplished, for example, through photolithography by reducing the wavelength of the light used for the imaging. Special resist systems, however, are necessary for the use of light in the deep ultraviolet light (DUV) having wavelengths that are below 300 nm. Specifically, a base polymer that is transparent to this wavelength range is necessary in addition to a PAC that "decomposes" in deep ultraviolet light. Whereas the PAC should initially have a high absorption in order to ensure a high sensitivity, it must bleach out during the course of the imaging exposure, i.e., it must become transparent again, with respect to the radiation that is used to expose after the photochemical reaction. The light can penetrate more deeply into the resist layer and the resolution, the contrast, and the edge steepness of the structures produced in this manner are greater the lower the residual absorption of the photoresist.

Although there are known resist systems that are adapted for use in the near ultraviolet region (NUV), these, however, exhibit a high residual absorption of the base polymers in the DUV. Moreover, they lose their desirable properties upon exposure to a wavelength of, for example, 248 nm (KrF excimer laser as light source). This results in poor values for contrast, sensitivity, resolution, and edge steepness of the resultant structures. It is therefore necessary to develop new resists for use in DUV lithography.

Reducing the wavelength of the light, likewise, reduces the depth of focus (DOF) and creates a further problem when a shorter-wavelength light is used. The behavior of the DOF can be expressed in the formula:

$$DOF = \pm f\frac{\lambda}{(NA)^2}$$

Although the contrast sharpness of imaged structures is more readily ensured using thin resist layers, thick resist layers are required, particularly for substrates that use topography steps. The thick layers are required, for example, in order to achieve a planarization.

To address this problem, a two-layer technique is used wherein an optically dense, planarizing, first resist layer is initially applied on the substrate and is subsequently covered with a second, thin, photolithographically structurable resist layer. In the structuring that follows, it is only this second resist layer that is initially exposed and developed. The structure that is created then serves as a mask for structuring the first resist layer through an anisotropic etching process, for example, with oxygen-containing plasma.

This technique compensates for the unevenness of the substrate and also prevents the generation of disruptive reflections from the substrate surface during the exposure. However, it is necessary that the second structurable resist layers, referred to as the top resist, have an adequate etching resistance with respect to, for example, oxygen plasma. To provide this etching resistance, certain elements are added to the base polymer, for example, silicon. Non-volatile oxides, that protect the top resist structures against further etching, are formed from these elements in the oxygen plasma.

An article by T. R. Pampalone in the periodical, Solid State Technology, June 1984, page 115 suggests the use of cresol-novolaks as a base polymer for DUV-compatible photoresists. Cresol-novolaks are known for their etching resistance in halogen plasma. Cresol-novolaks are used as the base polymer for longer-wavelength lithography processes in commercial photoresists. Even though the use of an increasing proportion of para-cresol in the novolak present as an isomer mix, improves the transmission for light in the deep ultraviolet light range, it cannot be reduced below an absorption coefficient $\alpha_{248}$ of 0.3 $\mu$m$^{-1}$. This absorption value limits the applicability of cresol-novolaks in DUV photoresists.

The Pampalone article also proposes poly (4-hydroxystyrol) for NUV and DUV photoresists. The poly (4-hydroxystyrol) exhibits an etching resistance comparable to novolaks, but, due to its high alkali solubility, has unacceptably high dark erosion rates in the development of resist mixtures. Therefore, it is unsuitable as a photoresist for sub-$\mu$m structures.

C. E. Osuch et al in SPIE Vol. 631, Advances in Resist Technology and Processing III (1986), pages 68-75 describes a further photoresist system for the DUV range. The photoresist system described makes use of a styrol-maleic acid imide copolymer having tertiary butoxy-carbonyl units, that block the imide groups, as a base polymer. The base polymer is used in combination with an acid-forming, photo-active component, in an alkali-soluble photoresist that is structurable by light in the DUV range.

This photoresist system, however, has the disadvantage that it does not bleach during exposure. Therefore, the system is limited to relatively thin film layers. Moreover, the photoresist system requires a developing process that includes an additional heating step that results in a loss of approximately 10% of the layer thickness and makes correspondingly thicker resist layers necessary. As a result thereof, structures of only approximately 0.75 $\mu$m can be resolved with this system (given a layer thickness of 1.25 $\mu$m).

Further DUV photoresists have been proposed for use in a two-layer resist technique. For example, in one system, a copolymer of trimethylsilylmethyl-methylacrylate and methylacrylic acid in a molar ratio of 1:1 is used as an alkali-soluble base polymer with 2-nitrobenzyl-cholate as a photoactive component for DUV top resists that contain silicon. This system, however, has a relatively low silicon content of about 8%, a low photosensitivity of 200 mJ/cm$^2$, and a maximum resolution of only about 0.75 $\mu$m. Accordingly, the applications of this system are also limited.

With respect to the trimethylsilyl groups in the alkali-insoluble base polymer poly (4-trimethylsiloxy-styrol), these can be split off by using a strong acid upon the formation of phenol groups. By using an onium salt as a photo-active component, the polymer is therefore suitable as a DUV resist, but only in limited fashion. However, the polymer does not bleach out during the exposure and therefore has a contrast of only about 1.2. Moreover, the base polymer has a low softening point of approximately 76° C. that prevents its use as a top resist for an oxygen plasma step, wherein temperatures of approximately 100° C. are reached.

SUMMARY OF THE INVENTION

The present invention provides a DUV-transparent base polymer for use in photoresists that can be developed in an aqueous-alkaline solution and that can be used for both one-layer, as well as for the two-layer processes.

To this end, an aqueous-alkaline developable photoresist for generating structures in the sub-$\mu$m region is provided. The photoresist comprises a developable base polymer and a photo-active component, the base polymer comprises anhydride functions. The anhydride functions control the solubility of the base polymer. As desired, the photoresist can include known additives.

In an embodiment of the present invention, the base polymer includes cyclic anhydride functions. In a preferred embodiment, approximately 10 to about 55 mole percent of base polymer is derived from maleic acid anhydride monomers.

In an embodiment of the present invention, the base polymer is a copolymer of monomers having anhydride functions and of further monomers selected such that the etching resistance of the photoresist to the plasma etching processes is increased. In a preferred embodiment, the further monomers are silicon-organic compounds that increase the etching resistance of the photoresist to oxygen-containing etching plasma. In a preferred embodiment, the further monomers are aromatic compounds. In an embodiment, the further monomers are chosen from the group of compounds having the following structures:

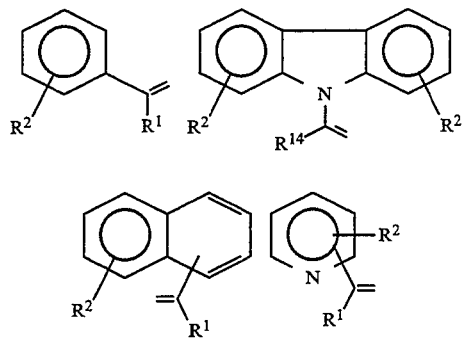

wherein
$R^1$ and $R^2$ independently are chosen from the group consisting of H, alkyl, aryl, and halogen.

In an embodiment of the present invention, the further monomers are compounds that include silicon or compounds that contain tin that have a structure chosen from the group consisting of:

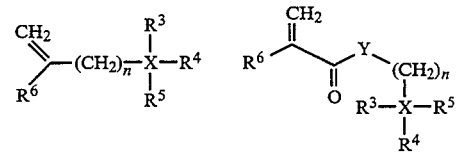

wherein:
$0 \leq n \leq 3$;
$R^3$ through $R^5$ independently are chosen from the group consisting of alkyl, aryl, alkoxy, aryloxy, and arylalkylradical;
$R^6$ is H or alkyl;
Y is O or NH; and
X is Si or Sn. The etching resistance of the photoresist to oxygen-containing etching plasma is thereby reinforced.

In an embodiment of the present invention, the base polymer has the structure:

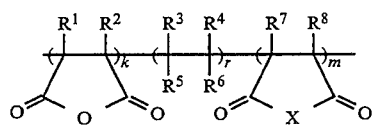

wherein:
the unit having the index k comprises approximately 10 to about 55% of the structure;
r or m can be equal to 0;
$R^1$ through $R^2$ and $R^4$ through $R^9$ are hydrogen, alkyl, aryl, halogen, halogen-substituted alkyl or aryl or an olefinically unsaturated radical;

$R^3$ is chosen from the group of compounds consisting of: hydrogen, alkyl, aryl, halogen, halogen-substituted alkyl or aryl, respectively, an olefinically unsaturated radical, methoxyphenyl,

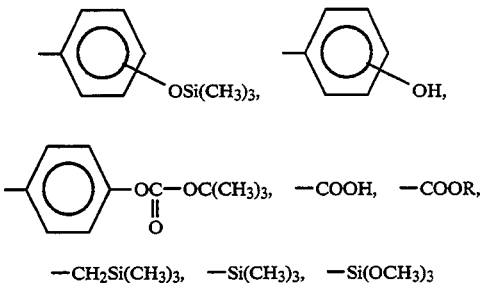

$-CH_2Si(CH_3)_3$,  $-Si(CH_3)_3$,  $-Si(OCH_3)_3$

X is chosen from the group consisting of O, NR, and S; and

R is chosen from the group consisting of H, alkyl, aryl, vinyl, allyl, or acryl.

In an embodiment of the present invention, the base polymer comprises units in a chain having the following structural formulas as regularly recurring units:

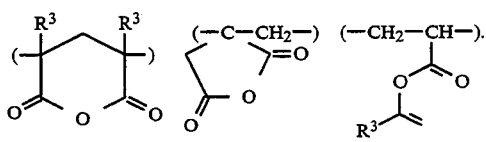

In an embodiment of the present invention, the base polymer is derived from anhydride monomers chosen from the group consisting of:

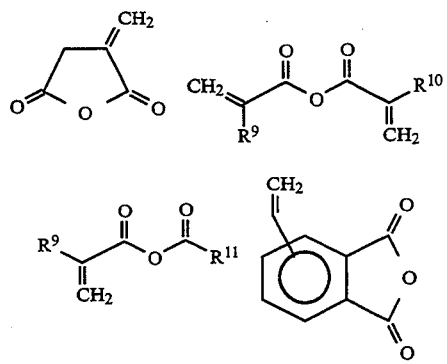

wherein:
$R^9$ and $R^{10}$ is H or alkyl; and
$R^{11}$ is an alkyl or aryl radical.

In an embodiment of the present invention, the photoactive component is a quinone diazide. In a preferred embodiment, the photo-active compound has a structure chosen from the group consisting of:

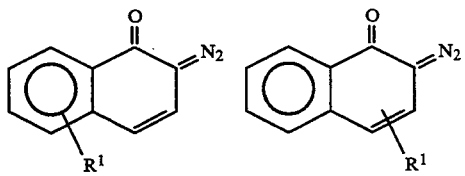

-continued

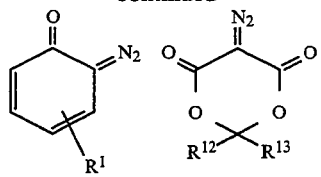

wherein:
$R^1$ is $-SO_3R$ or $-CO_2R$; and
$R^{12}$ and $R^{13}$ independently of each other can be chosen from the group consisting of an arbitrary organic radical, an aryl group, and H; and
R is chosen from the group of compounds consisting of alkyl, aryl, halogen alkyl, halogen aryl, or halogen.

In an embodiment of the present invention, the base polymer is an alternating copolymer that is derived from maleic acid anhydride monomers and styrol monomers or maleic acid anhydride and allyl trimethylsilane units.

In an embodiment of the present invention, the photoactive compound is a radical-forming agent or is a bisazide and the photoresist is a negative resist.

In an embodiment of the present invention, the members of the chain of the base polymer are linked by anhydride bonds.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
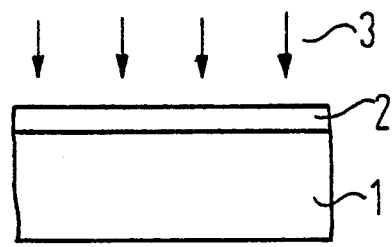
FIG. 1 illustrates a schematic cross-sectional view of a photoresist layer produced on a substrate.

The present invention provides a DUV-transparent base polymer for use in photoresists that are developable in an aqueous alkaline solution. In the photoresist of the present invention, the base polymer comprises anhydride functions as solution-mediating groups.

The base polymers used in the photoresist of the present invention have a high DUV transparency ($a_{248}$ less than 0.1 $\mu m^{-1}$). The base polymers are therefore suitable even for applications that require a high layer thickness of the photoresist on a wafer or some other substrate. The base polymers of the present invention have a high glass temperature above 160° C. The base polymers, and the photoresist compositions containing the base polymers, therefore, have a high thermal stability and accordingly, the photoresist can be used in many versatile applications. Due to its high glass temperature, the DUV photoresists of the present invention are particularly suited for plasma etching processes that use high temperatures. Due to the high glass temperature, there is no danger that the photoresist layers will soften or flow during the etching process or other high-temperature step.

By using photo-active components, such as, for example, quinonediazides, the positive photoresist achieves a high contrast. This is due to the great polarity difference between the hydrophobic anhydride function and the polar carbonic acid groups that arises during the developing process.

Despite the good developing capability of the photoresist of the present invention, it exhibits only a slight dark erosion (a decrease in the layer thickness of an unexposed photoresist layer in the developing process) of up to 5 nm. This corresponds to only approximately 0.5% in a photoresist layer having a layer thickness of 1.0 μm. A lower dark erosion requires a lower layer thickness of the photoresist in order to achieve a desired structural height in the developed photoresist structures. This also results in improved contrast, because a thinner resist layer exhibits better resolution in a lithographic process than does a thicker layer. Due to the high transparency of the base polymer of the present invention, a good resolution, even given greater layer thicknesses, is achieved and therefore structures are produced having steep edges.

The above advantages of the present invention, are achieved with a base polymer containing an anhydride function. Accordingly, the selection of compounds suitable as a base polymer in the present invention is only limited to those containing anhydride functions. For example, the base polymer can comprise cyclic anhydride functions. The cyclic anhydride functions can be contained both in the main chain, as well as, in the side chains of the base polymer. Non-cyclic, i.e., linear anhydrides, can also be used. A particular advantage is achieved with a photoresist wherein the constituents of the main chain of the base polymer are linked by anhydride bonds. Since the anhydride function is hydrolyzed upon development of the photoresist containing the anhydride, the chain of the base polymer is "exploded" and the solubility thereof is therefore enhanced during the development process.

The photoresist of the present invention can contain a base polymer that is derived 1 to 100 mole % from monomers carrying the anhydride function. In a preferred embodiment, a base polymer that is derived approximately 10 to about 55 mole % from maleic acid anhydride monomers provides an advantageous photoresist. When a copolymer of maleic acid anhydride (or other, arbitrary monomers that carry anhydride functions) and further monomers are used as a base polymer for the photoresist, then the further monomers of the copolymer can be selected such that the etching resistance of the photoresist to plasma etching processes is increased. Such further polymers can, for example, be silicon-organic compounds that increase the etching resistance of the photoresist to oxygen-containing etching plasma.

Aromatic groupings are desirable for applications of the photoresist as a mask in a halogen-containing plasma etching process. Aromatic compounds can also be selected as the further monomers noted above.

In an embodiment, the further monomers are chosen from the group of structures A, B, C, or D set forth below:

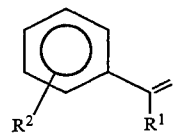

A

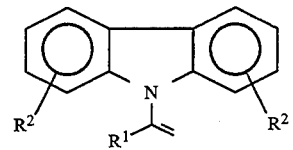

B

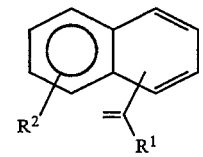

C

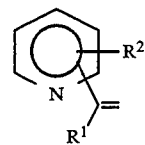

D wherein:

$R^1$ and $R^2$ are, independently of one another, H, alkyl, aryl, or halogen.

The etching resistance of the photoresist to oxygen-containing plasma is reinforced by both compounds that contain silicon, as well as, by compounds that contain tin. Such compounds, that can also be utilized as further monomers, include those having the structures E and F set forth below:

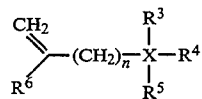

E

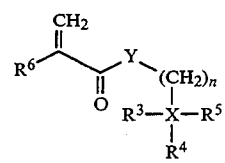

F wherein:

$0 \leq n \leq 3$, $R^3$ through $R^5$ independently represent a respective alkyl, aryl, alkoxy, aryloxy or aryl alkyl radical;

$R^6$ is H or alkyl;

Y is O or NH; and

X is Si or Sn.

A photoresist of the present invention can therefore comprise a base polymer having the structure G set forth below:

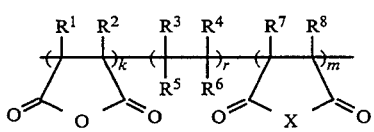

G wherein:
  the unit having the index k consists of approximately 10 to about 55% of the structure of the overall structure;
  k, r and m represent whole numbers, and r and m can have a value of 0;
  $R^1$ through $R^2$ and $R^4$ through $R^8$ represent hydrogen, alkyl, aryl, halogen, halogen-substituted alkyl or, respectively, aryl or an olefinically unsaturated radical;
  $R^3$ is chosen from the group consisting of hydrogen, alkyl, aryl, halogen, halogen-substituted alkyl or aryl, respectively, an olefinically unsaturated radical, methoxyphenyl,

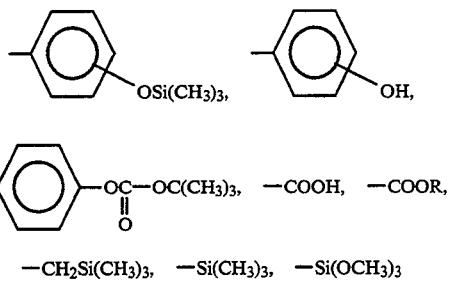

—$CH_2Si(CH_3)_3$, —$Si(CH_3)_3$, —$Si(OCH_3)_3$ wherein:
  X is O, NR, or S; and
  R is H, alkyl, aryl, vinyl, allyl, or acryl.

As regularly recurring units, the base polymer can also comprise units in its chain having the structural formulas H, I, and K set forth below:

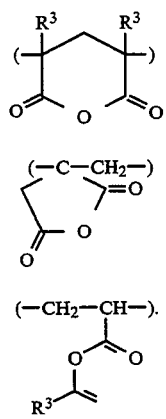

wherein:
  $R^3$ can be the groups previously discussed.

Further, the base polymer can be an anhydride monomer that has the structure L, M, N or O set forth below:

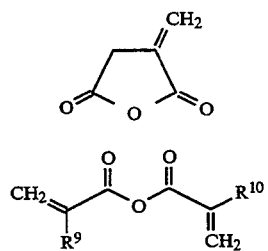

-continued

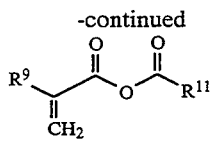

N

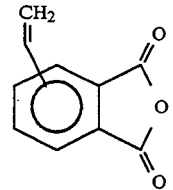

O wherein $R^9$ and $R^{10}$ are H or alkyl; and
  $R^{11}$ is an alkyl or aryl radical.

No special requirements are necessary for the photoactive components (PAC). Arbitrary PACs can be used for positively functioning photoresists insofar as they have a threshold energy that is matched to the light wavelength they are to be exposed to and they are converted into compounds having altered polarity and, thereby, compounds having an altered solubility or solubility inhibitor behavior. For example, quinone diazides are well-suited as PACs for the photoresists of the present invention.

By way of example, the PAC can have a structure chosen from P, Q, R, or S set forth below:

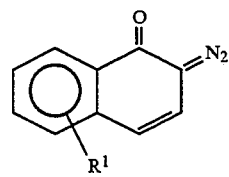

P

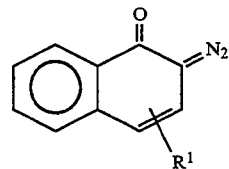

Q

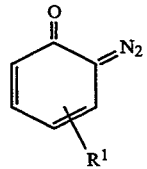

R

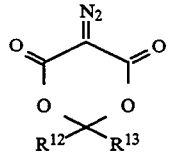

S wherein:
  $R^{12}$ and $R^{19}$ independently stand for an arbitrary organic radical or an aryl group;
  R' is —$SO_3R$ or —$CO_2R$; and
  R is an alkyl, aryl, halogen alkyl, halogen aryl, or halogen.

A carboxylic acid is created from such photo-active components by splitting nitrogen off and by a regrouping. Accordingly, the exposed regions of a photoresist layer containing this PAC are accessible to a hydrophilic attack by the alkaline developer solution. The PAC thereby does not promote dissolution of the base polymer, but merely facilitates the attack of the developer due to positive, polar interactions.

In a further embodiment of the present invention, radical-forming agents or bisazides can be used as the PAC. With such PACs, the photoresist acts as a negative resist. Upon exposure, a radical-forming agent promotes a cross-linking of the base polymer and, thus, reduces its solubility. The unexposed parts of the photoresist layer are then dissolved out with an appropriately stronger developer solution. The exposed and, thus, cross-linked regions of the photoresist layer, resist the developer solution.

The amount of PAC contained in the photoresist is relatively high since the solubility-promoting or, respectively, the solubility-inhibiting properties of the PAC are to be transferred to the photoresist. In an embodiment, the PAC is contained in a dry and solvent-free resist in an amount comprising approximately 10 to about 35 weight percent. In an embodiment, the PAC comprises approximately 15 to about 25 mole weight percent.

The PAC preferably has radicals that are adapted for use with the base polymer. For example, based on quinone diazides substituted with reactive carboxylic acid derivatives or, respectively, sulfonic acid derivatives, the conversion products with aromatic or aliphatic H-acid compounds such as alcohols, phenols and amines can be used as PAC. A 4- or, respectively, 5-sulfonic acid ester of naphthoquinone-diazide having multivalent phenols such as, for example, bisphenol A or 2, 3, 4-trihydroxybenzophenone is especially suitable as a photo-active component in the present invention.

In an embodiment of the present invention, alternating copolymers of maleic acid anhydride and allyl trimethylsilane or, respectively, of maleic acid anhydride and styrol are utilized as the base polymers. The use of these copolymers is dependent on the required etching resistance. The mole weight of these base polymers, in an embodiment, lies between approximately 1000 to about 100000. In a preferred embodiment, the mole weight lies between approximately 1500 to about 10000.

The hydrophobic anhydride groups present in the base polymer are not hydrolyzed, or are only slightly hydrolyzed, in standard, commercially available aqueous-alkaline developers. In an aqueous-alkaline developer, therefore, the photoresist of the present invention exhibits no solubility, or only a very slight solubility. But, standard aqueous-alkaline developers can nonetheless be used when primary or secondary amines or ammonia are added to them in an amount of approximately 0.0 to about 10 weight % and preferably approximately 0.1 to about 0.7 weight %. All primary and secondary mono-amines that are soluble in the aqueous-alkaline medium of the developer can be used, in this regard, in addition to ammonia.

The developing process, using the photoresist of the present invention, is based on the selective diffusion of the amines out of the developer into the exposed regions and the spontaneous reaction of these amines with the anthydride groups to form amidocarbonic acid units. The amidocarbonic acid units have a high alkali solubility and thus effect a high development rate of the exposed resist regions in the alkaline medium.

A great advantage of the base polymers of the present invention, in the photoresist, in combination with the developing process, is the great polarity difference between the hydrophobic, unexposed regions and the exposed regions that are only hydrophilized during the developing step:

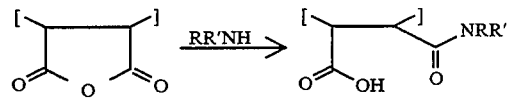

This high polarity change cannot be achieved in standard photoresists since alkali-soluble base polymers are used in these materials.

By way of example, and not limitation, the use of the photoresist of the present invention both for single-layer, as well as, for two-layer processes, shall be set forth below with reference to two, selected resist compositions, two developer solutions and three embodiments, as well as, with respect to the figures.

1. Manufacture of a solution of the resist composition a).

A ready-to-use photoresist solution a) is created by dissolving 16 weight parts of an alternating copolymer of maleic acid anhydride and styrel as the base polymer and 4 weight parts of a diester of naphthoquinone-4-sulfonic acid with bisphenol A as photo-active component in 80 weight parts (2-methoxy-1-propyl)-acetate.

2. Manufacturing a solution of the resist composition b).

A ready-to-use resist solution b) is then produced. In this example, the resist solution is produced by dissolving 16 weight parts of an alternating copolymer of maleic acid anhydride and allyl trimethylsilane as the base polymer and 4 weight parts of a diester of naphthoquinone-4-sulfonic acid with bisphenol A as the photo-active component in 80 weight parts (2-methoxy-1-propyl)-acetate.

3. Manufacturing the developer solution c).

The developer solution c) in this example, is produced with 1 weight part of a commercially obtainable developer AZ 400 K, diluted with 5 weight parts water and laced with 0.03 weight parts ammonia.

4. Manufacturing the developer solution d).

The developer solution d), in this example, is produced using 1 weight part of the developer AZ 400 K, diluted with 5 weight parts water and laced with 0.02 weight parts n-butylamine.

5. Coating, photo-structuring, and developing the resist a).

Figure 2:
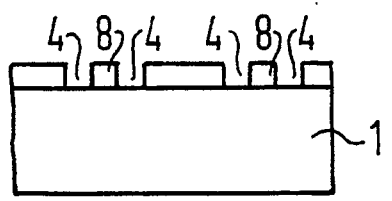
FIG. 2 illustrates, schematically, a scanning electron microscope image of the substrate of FIG. 1 having structures.

Referring now to FIGS. 1 and 2, a photoresist layer 2 is produced on a 3-inch silicon wafer 1 by spinning on a resist solution a. The resist layer is dried at 110° C. on a hot plate and has a layer thickness of 1.0 μm. A contact exposure 3 is performed with a photo-mask that has line structures of 2.0 through 0.5 μm. Given a wavelength of 248 nm, the required dose is 80 mJ/cm². The mask is removed and the wafer is now treated for 60 seconds with the developer solution c in a spray developer. The wafer is now rinsed with water and is dried at 110° C. on the hot plate.

FIG. 2 schematically illustrates scanning electron microscope images showing the structures that achieve a resolution up to 0.5 μm both for the ridges 8, as well as, for the trenches 4. Accordingly, the photoresist structures provide a clean image of the structure prescribed on the mask up to a structural width of the trenches 4 and of the ridges 8 of 0.5 μm and also steep edges remain in the photoresist layer 2 after the development. The dark erosion, measured at resist regions unexposed by the development, is 3 nm.

6. A structuring alternative for a layer having the resist composition a).

As in example 5, a layer 2 having the resist composition a) is applied onto a substrate 1. The resist composition is applied to a thickness of 1.0 μm and is dried. The exposure, in this example, is with a dose of 70 mJ/cm$^2$ and the developer solution d) is used for developing. A scanning electron microscope analysis of the produced photoresist structures likewise shows a resolution of up to a structural width of 0.5 μm both for ridges, as well as, for trenches given a simultaneously high edge steepness of the sidewalls. The dark erosion is 5 nm. 7. Use of the resist composition b) as top resist.

Figure 3:
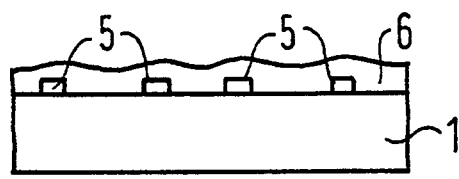
FIG. 3 illustrates a schematic cross-sectional view of a photoresist applied on a substrate.

Referring now to FIGS. 3 through 6, a 1.8 μm thick layer of a commercially available photoresist (MP 1450 J) is applied and cross-linked at 210° on an arbitrary substrate 1. The substrate 1 can be, for example, an integrated circuit that comprises interconnects 5 covered with an insulating layer 3 and that, as shown in FIG. 3, has an uneven surface.

Figure 4:
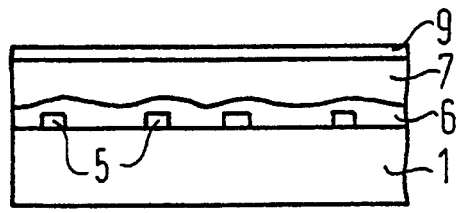
FIG. 4 illustrates the structure of FIG. 3 after a further photoresist layer is applied.

A 1 μm thick layer of the resist composition b) is applied onto the photoresist layer 7, having a planarizing effect that represents the bottom resist and is dried at 110° on the hot plate. FIG. 4 illustrates a schematic cross-section through the layer structure obtained in this manner.

Figure 5:
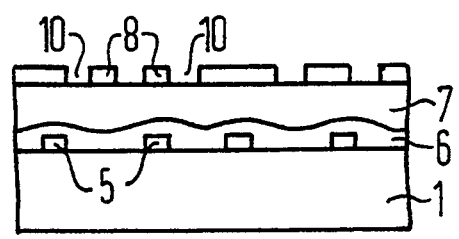
FIG. 5 illustrates the structure of FIG. 4 after it has been treated with a developer solution.
Figure 6:
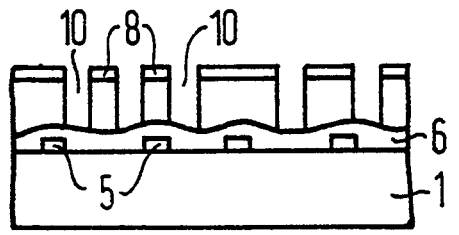
FIG. 6 illustrates a schematic cross-sectional view of a resultant structure created using the method of the present invention.

The resist layer 9 is contact exposed at a wavelength of 248 nm and a dose of 70 mJ/cm$^2$ through a mask that has various line structures having a width of 2.0 to about 0.5 μm. FIG. 5 illustrates the structure after the photoresist layer 9 was treated with the developer solution d. After 75 seconds of development, the structure was rinsed with water and dried at 110° C. Scanning electron microscope images, in this example, also showed that the trenches 10, as well as the ridges 8, were well-resolved up to a width of 0.5 μm and had a great edge angle. No dark erosion could be found.

Upon use of the structured resist layer 9 as an etching mask, the structure was etched under anisotropic oxygen-RIE conditions in a plasma reactor at 6 mTorr oxygen gas pressure and 410 volts bias voltage. The structure produced in the photoresist 9 was cleanly transferred onto the resist layer 7 lying therebelow. Both ridges, as well as trenches, were resolved in the bottom resist layer up to 0.5 μm given vertical edges, as may be seen, for example, in FIG. 6.

As illustrated by the above examples, there are a great many embodiments and uses of the photoresist of the present invention. The photoresist can be used in both single-layer, as well as, in two-layer processes, by slight variation of the composition of the photoresist. Use of the photoresist is therefore simple and can be implemented in standard apparatus. The resist is suitable for deep ultraviolet light and exhibits good resolution therein up to at least 0.5 μm given high contrast and steep, obtainable edge angles. The etching resistance and the light sensitivity are high, but the dark erosion is low, so that a dimensionally true structure can be generated or transferred.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. An aqueous-alkaline developing positive photoresist for producing structures in the sub-μm range having a base polymer which is a copolymer of a monomer comprising an anhydride function and further monomers and a photoactive constituent that is contained in a proportion of 2 through 25% by weight in the photoresist and which comprises o-quinone diazide, wherein the further monomers are silicon-organic and tin-organic compounds that increase the etching resistance of the photoresist to oxygen-containing etching plasma and contain a compound chosen from the group consisting of silicon and tin and have at least one of the following structures:

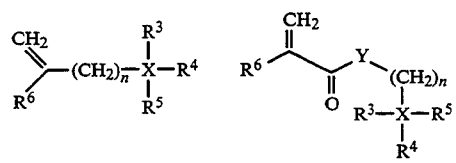

wherein:
  $0 \leq n \leq 3$;
  $R^3$ through $R^5$ independently of each other are chosen from the group consisting of an alkyl, aryl, alkoxy, aryloxy, or arylalkylradical;
  $R^6$ is H or alkyl;
  Y is for O or NH; and
  X is Si or Sn,
whereby a layer of the photoresist is exposed imagewise with radiation around the deep ultraviolet light (DUV) range and is then developed with an aqueously-alkaline medium which additionally contains 0.01 through 10% by weight ammonia or a primary or secondary amine, and whereby the resist layer exhibits low dark erosion up to 0.5% of the layer thickness of the resist layer after development.

2. The photoresist of claim 1 wherein the base polymer is derived from anhydride monomers chosen from the group consisting of:

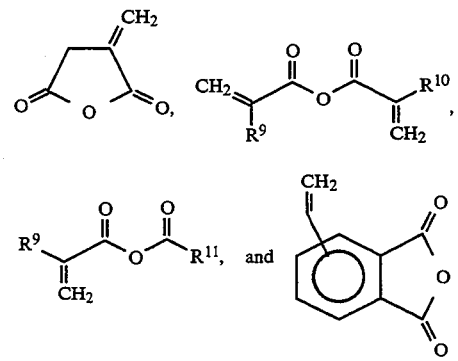

wherein:
  $R^9$ and $R^{10}$ are chosen from the group consisting of H and alkyl; and
  $R^{11}$ is chosen from the group consisting of alkyl and aryl.

3. The photoresist of claim 1 wherein the base polymer is an alternating copolymer having maleic acid anhydride and allyl trimethylsilane units.

4. The photoresist of claim 3 wherein the mole weight of the base polymer lies between approximately 1000 to about 100000.

5. The photoresist of claim 3 wherein the mole weight of the base polymer lies between approximately 1500 to about 10000.

6. An aqueous-alkaline developing positive photoresist for producing structures in the sub-$\mu$m range having a base polymer which is a copolymer of a monomer comprising an anhydride function and further monomers and a photoactive constituent that is contained in a proportion of 2 through 25% by weight in the photoresist and which comprises o-quinone diazide, wherein the further monomers are aromatic compounds that increase the etching resistance of the photoresist to etching plasmas and are selected from the group of compounds having the following structural formulas:

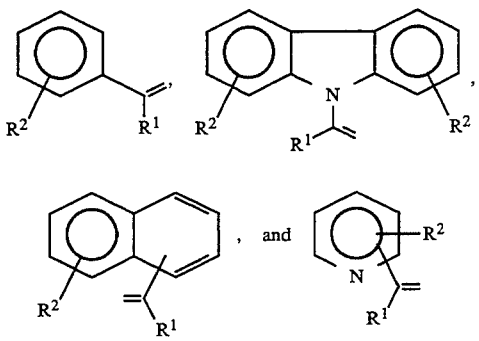

wherein
R$^1$ and R$^2$ independently are selected from the group consisting of H, alkyl, aryl, and halogen, and whereby a layer of the photoresist is exposed image-wise with radiation around the deep ultraviolet (DUV) range and is then developed with an aqueously-alkaline medium which additionally contains 0.01 through 10% by weight ammonia or a primary or secondary amine, and whereby the resist layer exhibits low dark erosion up to 0.5% of the layer thickness of the resist layer after development.

7. The photoresist of claim 6 wherein the base polymer is derived from anhydride monomers chosen from the group consisting of:

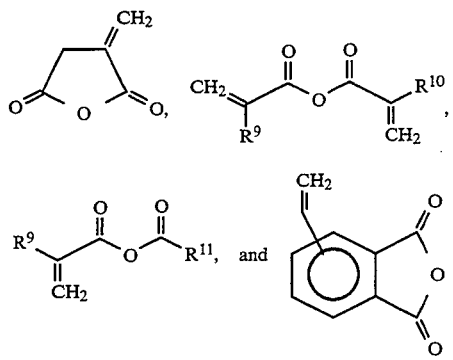

wherein
R$^9$ and R$^{10}$ are chosen from the group consisting of H and alkyl; and
R$^{11}$ is chosen from the group consisting of alkyl and aryl.

* * * * *